United States Patent [19]
Brinket et al.

[11] Patent Number: 5,514,258
[45] Date of Patent: May 7, 1996

[54] SUBSTRATE PLATING DEVICE HAVING LAMINAR FLOW

[76] Inventors: Oscar J. Brinket; Brian C. Brinket, both of 3816 Montego Dr., Huntington Beach, Calif. 92649

[21] Appl. No.: 292,417

[22] Filed: Aug. 18, 1994

[51] Int. Cl.⁶ .............................. C25D 5/08; C25D 17/00
[52] U.S. Cl. .................. 204/237; 204/239; 204/273; 204/284; 204/275; 204/297 R
[58] Field of Search ................. 204/224 R, 273, 204/237, DIG. 7, 297 R, 297 W, 239, 275, 284

[56] References Cited

U.S. PATENT DOCUMENTS

| | | | |
|---|---|---|---|
| 3,415,732 | 12/1968 | Komjathy | 04/237 |
| 3,649,509 | 3/1972 | Morawetz et al. | 204/238 |
| 3,682,809 | 8/1972 | Marquardson et al. | 204/275 |
| 3,751,355 | 8/1973 | Mandroian | 204/228 |
| 3,875,032 | 4/1975 | Thompson | 204/109 |
| 3,926,748 | 12/1975 | Lerner | 205/247 |
| 4,053,377 | 11/1977 | Schlain et al. | 204/106 |
| 4,065,374 | 12/1977 | Asami et al. | 204/228 |
| 4,102,756 | 7/1978 | Castellani et al. | 204/273 X |
| 4,120,759 | 11/1978 | Asami et al. | 205/82 |
| 4,304,641 | 12/1981 | Grandia et al. | 204/DIG. 7 X |
| 4,466,864 | 8/1984 | Bacon et al. | 205/105 |
| 4,696,729 | 9/1987 | Santini | 204/224 R |
| 4,773,983 | 9/1988 | Shyu | 204/273 |
| 4,882,026 | 11/1989 | Yamato et al. | 204/275 |
| 5,024,746 | 6/1991 | Stierman et al. | 204/297 W |
| 5,228,967 | 7/1993 | Crites et al. | 204/228 |
| 5,256,274 | 10/1993 | Poris | 205/123 |
| 5,273,642 | 12/1993 | Crites et al. | 205/118 |

*Primary Examiner*—Donald R. Valentine
*Attorney, Agent, or Firm*—Price, Gess & Ubell

[57] ABSTRACT

The present invention provides an apparatus for electrodepositing metals onto a substrate or the like which creates a uniform laminar flow of the electroplating solution across the surface of the substrate. Specifically, the plating bath according to this invention utilizes an insert plate with a plurality of conical-shaped apertures and a cylindrical tunnel plate to create and maintain a laminar flow of the solution across the surface of the substrate. Additionally, every plate in the invention can be separately and slidably removed to facilitate easy disassembly for cleaning and user customization to achieve the various results and specifications desired by the user.

19 Claims, 4 Drawing Sheets

SUBSTRATE PLATING DEVICE HAVING LAMINAR FLOW

BACKGROUND OF THE INVENTION

1. Field of the Invention

The present invention generally relates to a device for the electroplating and fabrication of electronic devices and components and in particular, relates to a plating bath device for use in the semiconductor industry to plate various metals onto substrates suspended in a liquid having laminar flow.

2. Description of Related Art

A substrate must be coated with certain metals in order to accommodate etching and photoresist lift off for integrated circuits and the like on the substrate. These various metals may be deposited using a number of techniques, such as electron beam evaporation or electroplating.

Electroplating is commonly used in the electronics industry. Since a great number of electronic devices are manufactured using lithographic (photoresist) processes to reproduce patterns on substrates, it is highly desirable to achieve a consistent layer distributed across an entire substrate, and to repeat this consistency from substrate to substrate. In other words, to achieve a high precision image transfer, profiles across the substrate must be uniform in line width and depth.

A disadvantage associated with prior art techniques is that of relatively uneven flow of the fluid of an electroplating tank. This fluid, commonly referred to as electroplating solution, is circulated about a predetermined path in the prior art in an attempt to maintain uniformity in the deposited materials. The frequency of the electroplating solution passing over a given portion of a substrate determines deposition rate and uniformity across the substrate.

In electroplating processes one must use strong solution agitation to ensure electrochemical reaction. However, the strong agitation hinders the deposition uniformity effect across the substrate. This dilemma is not suitably resolved by the any of the prior art.

One prior art device utilizes a propeller to drive the electroplating fluid and a complex baffling system to attempt to transform the turbulent fluid stream into a laminar flow stream. Another prior art device consists of a commercial embodiment of a device in which a silicon substrate is placed upside down in a bath and a fountain of electroplating solution flows up against the substrate to plate it. In additional to being cost prohibitive, this splashing method fails to adequately provide a consistent and accurate plating thickness across the surface of a semiconductor substrate. Thus, a problem has existed in the prior art for a plating bath which provides a uniform fluid flow of the electroplating solution during electroplating of a substrate.

OBJECTS AND SUMMARY OF THE INVENTION

The present invention provides an apparatus for electrodepositing metals, such as gold, silver, copper or nickel onto a substrate or the like which utilizes a laminar uniform flow of the electroplating solution across the surface of the substrate. The plating bath according to this invention includes a container for holding an electrodepositing solution. The electrodepositing solution circulates from a source end of the container through various plates to a destination end of the container. From the destination end of the container, the solution exits the container and passes through a pump back to the source end of the container. Each of the various plates through which the fluid passes has a particular function which will be detailed below. Additionally, every plate can be separately and slidably removed to facilitate easy disassembly for cleaning.

The design of the plates allow quick removal and replacement with alternate plates allowing user customization. Such customization permits each user to achieve the various results and specifications desired depending on variations such as the required thickness of the plating, the number of substrates, the substrate size, a single or multi-bath system. Additionally the simplicity of plate design lends itself to ease of mass production.

A diffusion plate for routing the electrodepositing solution is positioned at the source end of the container. The diffusion plate accepts the electrodepositing solution from the pump and feeds the electrodepositing solution through an insert plate which is removable from the diffusion plate.

The insert plate operates to control the flow of the electrodepositing solution from the diffusion plate into the source end of the container. This insert plate includes a number of apertures which are conical-shaped to create a laminar flow of the electrodepositing solution. After flowing past an anode, the electrodepositing solution passes through a cylindrical tunnel, which further enhances the laminar flow of the electrodepositing solution. The insert plate, in combination with the tunnel plate, solves the previous dilemma between the desirability of strong solution agitation and the need for metal plating uniformity across the substrate.

A substrate holding plate holds the substrate to facilitate a connection between the substrate and a cathode connected to a power supply. Apertures are positioned within the substrate holding plate to allow passage of the electrodepositing solution therethrough, while maintaining a laminar flow and even dispersal of the fluid solution across the surface of the substrate.

The present invention achieves consistent metal deposition across the substrate, minimizing the profile variations across the substrate in line width and depth, thus allowing high precision image transfer during later substrate processing. These excellent results are due in part to the ability of the present invention to control the flow across the substrate surface with the insert plate. Further, the design of the plating bath of the present invention provides a device which lends itself to user customization to achieve significantly better results at a lower cost than the prior art devices with increased reliability due to fewer mechanical parts.

BRIEF DESCRIPTION OF THE DRAWINGS

The objects and features of the present invention, which are believed to be novel, are set forth with particularity in the appended claims. The present invention, both as to its organization and manner of operation, together with further objects and advantages, may best be understood by reference to the following description, taken in connection with the accompanying drawings.

FIG. 5 is a cross-sectional view of the insert plate of the presently preferred embodiment.

DETAILED DESCRIPTION OF THE PREFERRED EMBODIMENTS

The following description is provided to enable any person skilled in the art to make and use the invention and sets forth the best modes contemplated by the inventors of carrying out their invention. Various modifications, however, will remain readily apparent to those skilled in the art, since the generic principles of the present invention have been defined herein specifically.

The substrate plating device of the presently preferred embodiment can be in the semiconductor industry to plate substrates with metals. The substrates to be plated may be fabricated of silicon, gallium-arsenide, glass, or ceramic, and are normally two inches in diameter or larger. Metals which are plated upon the substrates can include gold, copper, silver, platinum, or nickel. To achieve the goal of maintaining a uniform profile across the surface of a plated substrate, the presently preferred embodiment incorporates an insert plate having conical apertures and a tunnel plate having a cylindrical cross-section. These two items, in combination with other features of the present invention, can be configured in numerous embodiments. The process for creating a laminar flow of the electroplating solution is similar in each configuration.

Figure 1:
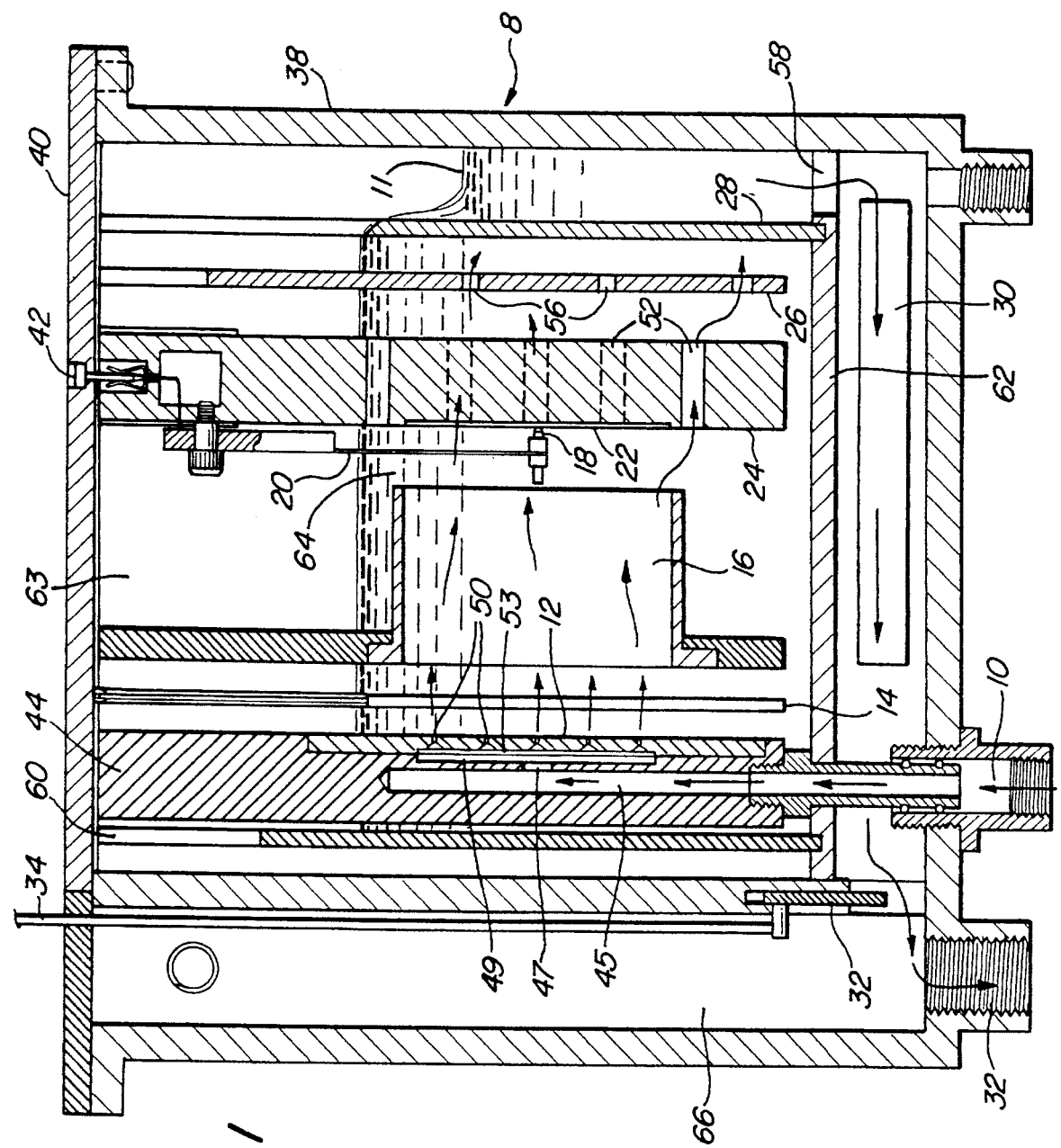
FIG. 1 is a cross-sectional view of the substrate plating device of the presently preferred embodiment.

The presently preferred embodiment of a cross-sectional view of the substrate plating device 8 is shown in FIG. 1. The device includes an outer container shell 38 for holding an electrodepositing solution. The device is divided into an inner plating bath 64 and an outer circulating chamber 66. The inner plating bath 64 is defined by an inner wall partition 60, a floor partition 62 and an overflow plate 28, together with the two slotted side plates 63 adjacent the walls of outer container shell 38. An electrolytic fluid, the electroplating solution 11, which may contain a desired plating material such as gold or silver, is circulated by a pump filter system (not shown). The electroplating solution 11 is pumped through the pump filter system to enter the substrate plating device 8 through an inlet 10. Depending on the specification of the user, the pump and/or filter may be located within the outer shell 38 or located external to the shell and connected by suitable fluid conduit.

The electroplating solution 11 is forced up into the diffusion plate 44 through an internal channel 45. The internal channel 45 acts to distribute the solution 11 equally between the substrates being plated. Attached to the diffusion plate 44 is the insert plate 12. The insert plate 12 preferably comprises a one-quarter-inch-thick sheet of polypropylene. The insert plate 12 is designed to slide into slots within the side plates 63 to allow quick removal and replacement with alternate plates to permit user customization. For example, for a second bath, the user may switch insert plates for depositing nickel or copper on a substrate since these metals require a higher velocity to achieve suitable plating than the velocity required for plating gold.

The electroplating solution 11 flows from the diffusion plate 44 and through insert plate apertures 50. The size and pattern of the apertures 50 can vary, depending on substrate design parameters. In the preferred embodiment, each of the apertures 50 are conically-shaped to create a laminar flow of the electrodepositing solution 11. In an especially preferred embodiment the apertures are formed by drilling a 0.050 inch diameter hole, with a 0.250 inch countersink 0.100 inches deep.

Figure 2:
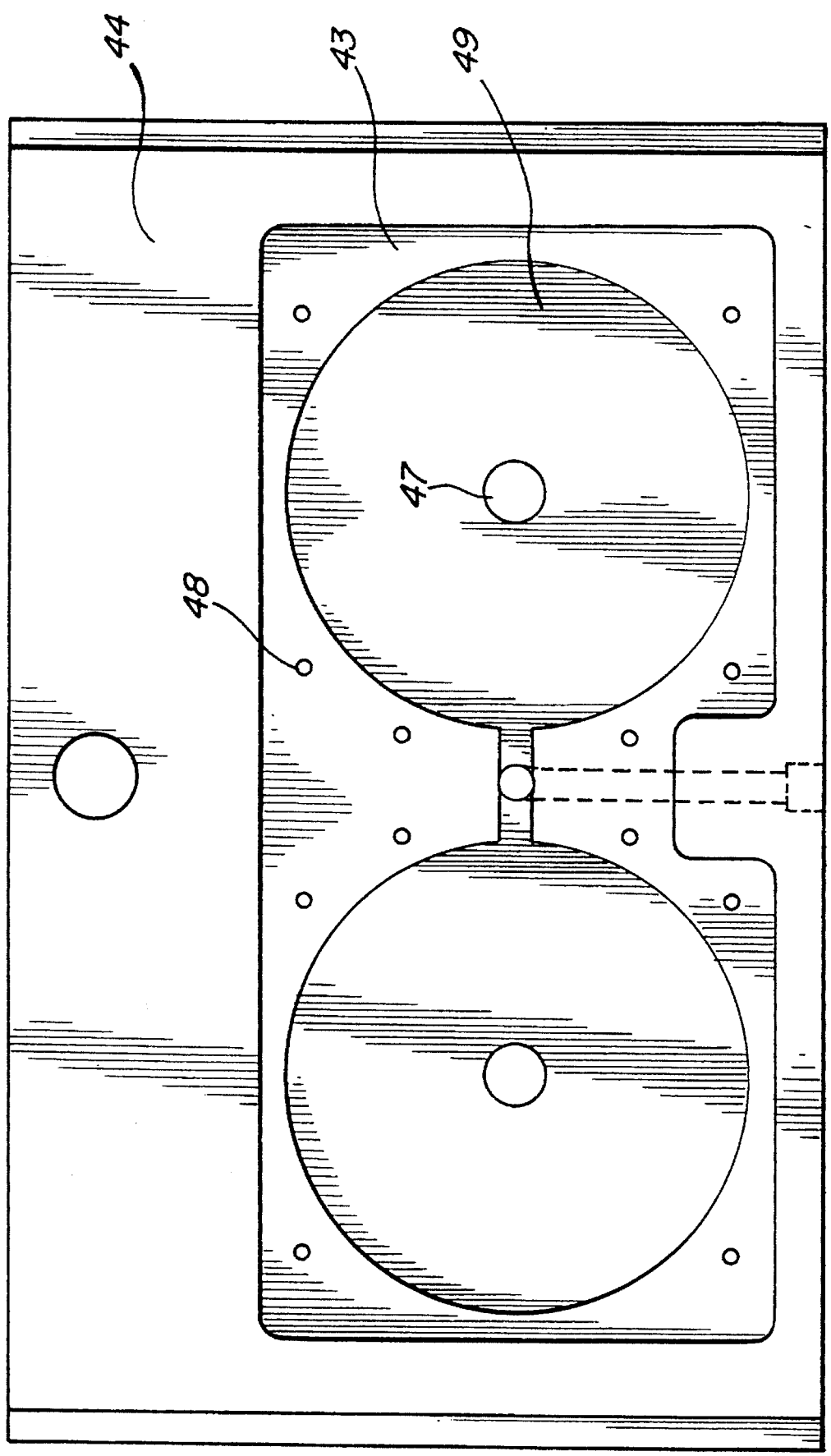
FIG. 2 is a planar view of the diffusion plate of the presently preferred embodiment.

A planar view of the back or downstream side of the diffusion plate 44 is shown in FIG. 2. The diffusion plate 44 preferably comprises a one-inch to one and one-half inch thick sheet of polypropylene. Each of the apertures 48 can accommodate a bolt, screw, rivet, or other fastening means for securing the insert plate 12 to the diffusion plate via similar apertures 48 located on the insert plate 12. An area on the back or downstream side of the diffusion plate 44 is hollowed to receive the insert plate 12. The hollowed area 43 further contains a recess 49. The recessed area 49 on the diffusion plate 44, together with the recessed area 53 on the insert plate 12, provide a chamber 46 between the diffusion plate 44 and the insert plate 12. This chamber is shown in FIG. 1 at 46. In the preferred embodiment, the recess 49 in the diffusion plate is 1/8 inch deep, circular in shaped and approximately of equal diameter to the diameter of the substrates being plated. Likewise, in the preferred embodiment, the recess 53 in the insert plate is 1/16 inch deep, circular in shaped and approximately of equal diameter to the diameter of the substrates being plated.

Looking at FIG. 1, the pressurized electroplating solution 11 is forced through the internal channel 45 and out the hole 47 in the diffusion plate 44 to be dispersed in the chamber 46. The electroplating solution 11 in the chamber 46 is then forced through apertures 50 in insert plate 12.

Figure 3:
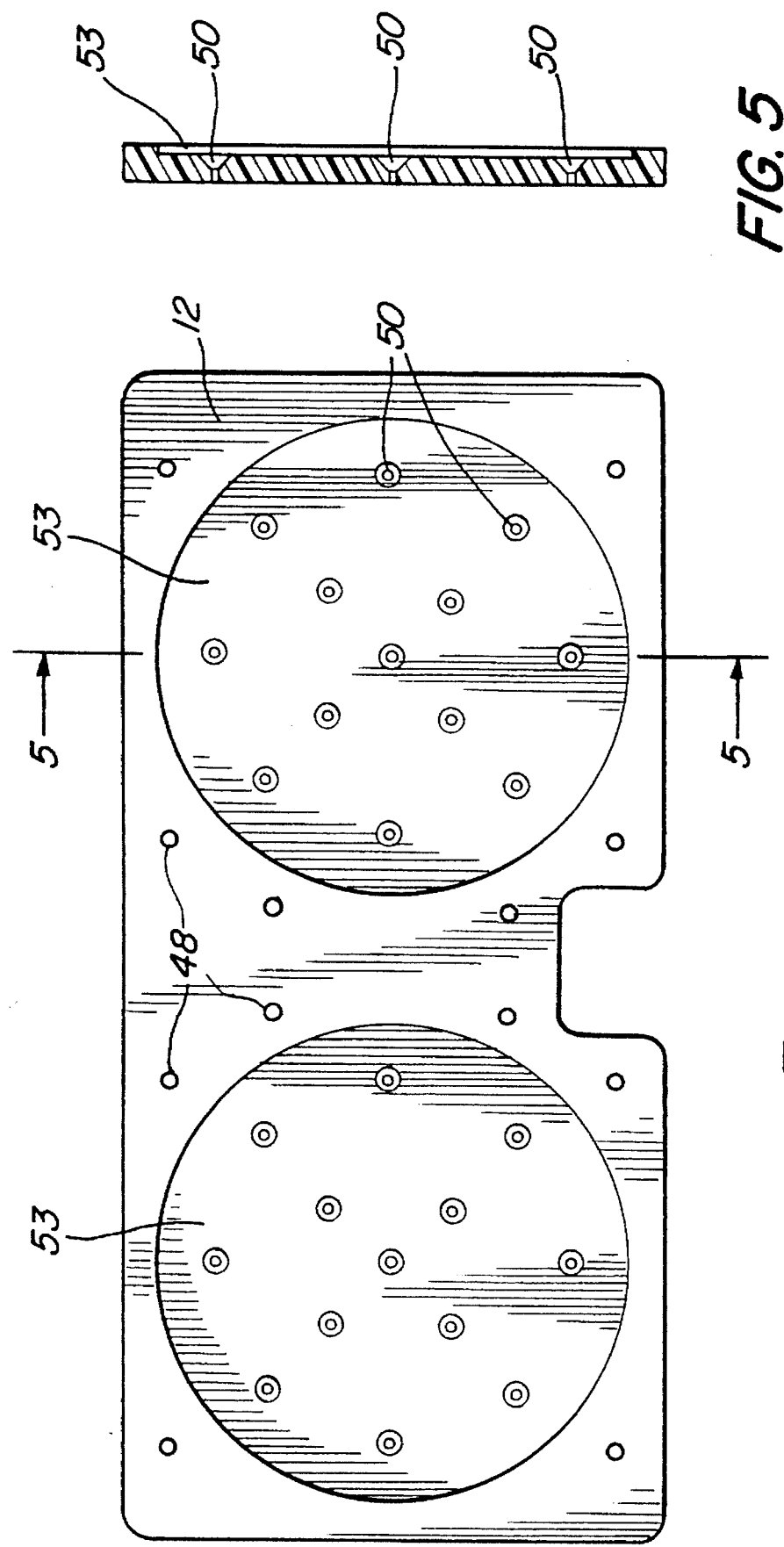
FIG. 3 is a planar view of the insert plate of the presently preferred embodiment.

As shown in FIG. 3, the apertures 50 are generally radially spaced on the insert plate 12 in an area which corresponds to the recessed areas 46 of the diffusion plate 44 when the diffusion plate 44 is secured against the insert plate 12 via the apertures 48. In the preferred embodiment, twenty-six apertures are positioned in a generally radial pattern.

Fluid exiting the apertures 50 in the insert plate 12 has a slower velocity and a lower pressure due to the conical shape of the apertures 50. Accordingly, this fluid has a generally uniform flow and has less turbulence than would occur without conical-shaped apertures. The electroplating solution 11 flowing from the apertures 50 thus combines and mixes with surrounding fluid to create a laminar flow through and around the anode 14. With the anode in the flow of agitated solution, the effectiveness of the plating solution is boosted and the conductivity is increased, both factors favoring uniform deposition.

To deposit gold on a substrate, an electroplating fluid with gold in solution is circulated and an anode comprising a platinum-coated titanium mesh is used. When depositing nickel or copper, nickel and copper anodes are used respectively. Because photoresist is use in the process of electroplating, anodes such as copper routinely become contaminated with photoresist and must be clean and acid etched. Like the other plates, the anode plate 14 is designed to slide into slots within the side plates 63 to to allow quick removal.

After flowing through and around the anode 14, which may comprise a plurality of rods or plates or a mesh, the electroplating solution 11 passes into and through a tunnel plate 16. The tunnel plate 16 has a cylindrical cross-section, and thereby evenly distributes the flow of the electroplating solution 11 therethrough. The tunnel plate 16 is preferably comprised of polypropylene is designed to slide into slots within the side plates 63 to allow quick removal and replacement with alternate tunnel plates to facilitate user customization. Additionally, the cylindrical cross-section of the tunnel plate 16 matches the circular surface of the substrate 22, such that the fluid flow is directed and aligned in the tunnel 16 and contacts the substrate 22 uniformly and perpendicularly. The laminar flow of the electroplating solution 11 across the surface of the substrate 22 allows for accurate and uniform electroplating of metals, such as gold, silver, copper, platinum or nickel on the substrate 22. The electrical circuit within the bath incorporates an anode and a cathode in contact with the substrate, both connected to a power supply. Power is supplied to the cathode 18 via an opening 42 in the substrate plating device 8. The electrical circuit is closed by the plating solution 11 in the bath.

Once the substrate is positioned on the substrate holding plate, the cathode 18 is brought into contact with the substrate 22 at contact points on the substrate. The contact points are normally located peripherally on substrate so as not to disrupt the plating process. However, the contact points may be located at different areas on the substrate, for example, a set of contact points might comprise three contact points spaced apart, a contact point when plating gold, a contact point when plating nickel, and a contact point when plating copper.

The cathode is held in position by a cathode arm 20. In a first embodiment, the cathode arm 20 is connected to a side arm with a pinion, the pinion being a thin spring-loaded piece of metal, preferably beryllium copper. The arm 20 is thus adjustable, and preferable Teflon-coated. In this embodiment, the cathode tip may be replaced separately from the entire arm. In the preferred embodiment, the cathode 20 is manufactured from a single piece of beryllium copper, and is preferable Teflon-coated.

Figure 4:
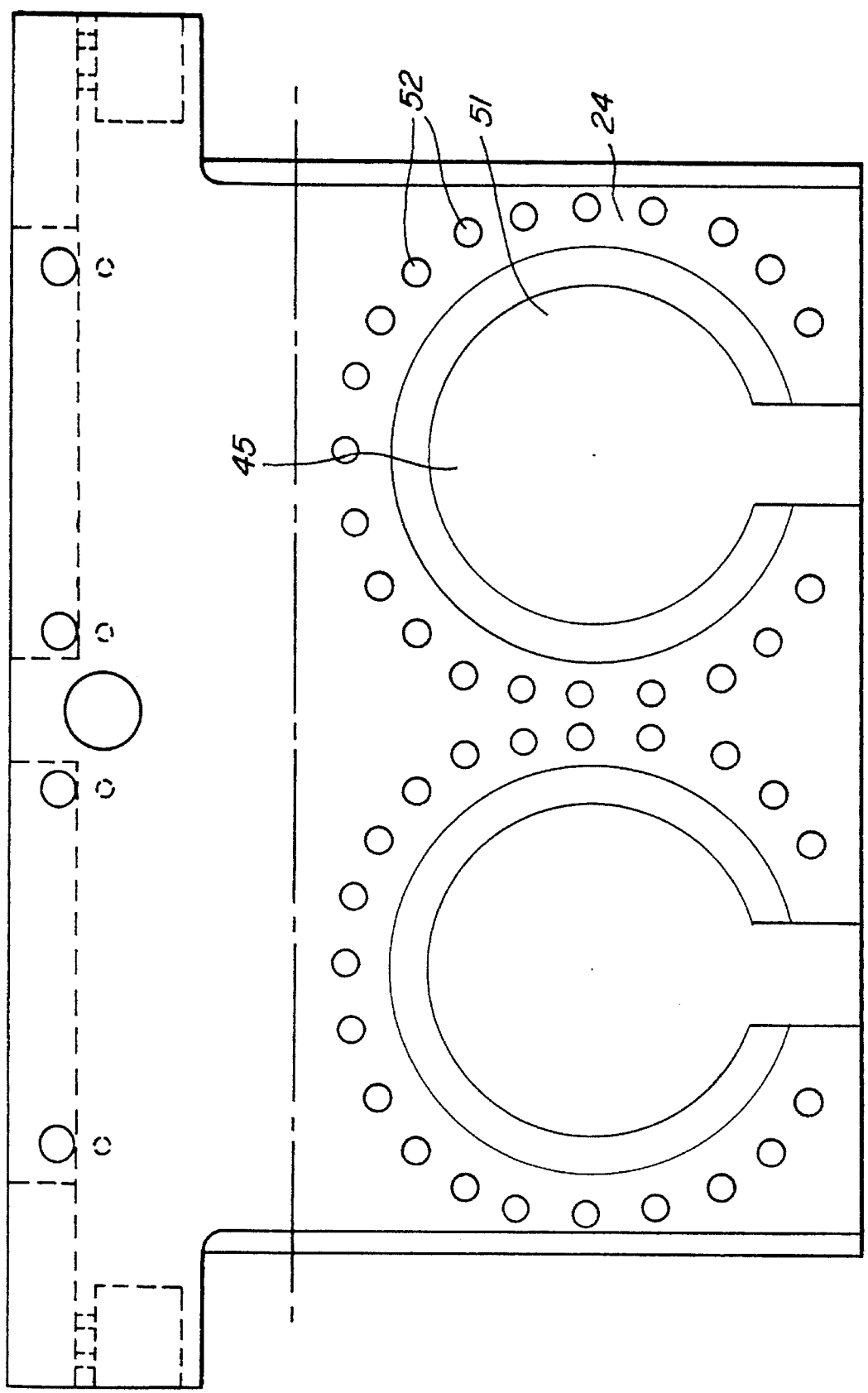
FIG. 4 is a planar view of the substrate holding plate of the presently preferred embodiment.

The substrate 22 is supported within a recess 51 on a substrate holding plate 24. A planar view of this substrate holding plate 24 is shown in FIG. 4. The substrate holding plate 24 preferably comprises a one-inch to one and one-half inch thick sheet of polypropylene. The substrate holding plate 24 is designed to slide into slots within the side plates 63 to allow quick removal and replacement with plates to facilitate user customization. For example, the substrate holding plate 24 may be configured to hold a single substrate or any number of multiple substrates. Likewise, the substrate holding plate 24 may be configured to hold various substrate sizes, for example four-inch, five-inch, six-inch or eight-inch substrates depending on the user's requirements.

Every plate is separately and slidably removable thus facilitating user customization by changing configurations simply and quickly. Such customization permits each user to achieve the various specifications desired depending on variations such as the required thickness of the plating, the number of substrates, the substrate size, a single or multibath system.

In a preferred embodiment, two recessed areas 51 are preferably one-tenth-inch deep to accommodate a substrate 22. Electroplating solution 11 passing over each substrate 22 is routed into one of the substrate plate apertures 52. These substrate plate apertures 52 are positioned within the substrate plate and spaced around each substrate 22 to provide for a uniform laminar flow of the fluid solution 11 across the surface of the substrate and through the substrate plate apertures 52.

Because the electroplating solution 11 is expensive it is desirable to minimize the volume of solution in the bath while maintaining a constant flow rate and a fluid level which encompass the substrates. Further, it is desirable to maintain the same fluid level on the front side of the substrate plate as on the back side. If the holes are too small in the substrate plate, then the fluid level on the front or substrate side of the plate will begin to rise, and corresponding the level on the backside will drop down. Maintenance of the desired fluid level is achieved in the present invention by redundant means to control the fluid level, including a fluid control plate 26, an overflow plate 28, and a fluid return gate 32. Likewise, the fluid flow rate may also be regulated by modifying the hole sizes in the different plates, altering the pump speed, or modulating the fluid control valve.

The fluid control plate 26 is positioned behind the substrate holding plate 24, and similarly includes apertures 56 for passing the electroplating solution 11 therethrough. The fluid control plate 26 is preferably comprised of polypropylene is designed to slide into slots within the side plates 63 to allow quick removal and replacement with alternate plates to facilitate user customization. The electroplating solution 11 fluid passes the control plate 26 to contact the overflow plate 28.

The overflow plate 28 functions to maintain the liquid level in the tank, which further results in highly uniform temperature control of the plating solution. Looking at FIG. 1, the level of the electroplating solution 11 is generally close to the top of the uppermost substrate plate aperture 52. The level of the electroplating solution 11, however, drops after passing over the overflow plate 28. In the preferred embodiment, the level drops approximately to the level of the substrate plate aperture 52 positioned just below the topmost substrate plate aperture 52, approximately an inch below the inner tank level.

The overflow plate 28 further functions to insure effective solution movement. Without effective solution movement, a large percentage of particles and other contaminants descend to the bottom of the tank. With the overflow plate, particles are suspended in solution to be trapped into the filter.

As with most of the elements in the presently preferred embodiment of the substrate plating device 8, the dimensions of the overflow plate 28 may be changed according to design preference. Thus, the overflow plate 28 may be configured to allow for a higher level of the electroplating solution 11 or for a lower level of the electroplating solution 11. In addition, a liquid level sensor may be added, whereby the sensors sounds an alarm to warn of the low level condition or automatically introduces additional fluid to raise the level to that desired.

After passing over the overflow plate 28, the electroplating solution 11 passes through an opening 58 and around a heater assembly 30. The heater assembly 30 is utilized to increase or maintain the temperature of the electroplating solution 11 as it passes across the heater assembly 30 from right to left in FIG. 1. In many instances, the electroplating solution 11 is heated as it passes through the pump. However, it is preferable to minimize such heat transfer in order to maintain optimal temperature control. The electroplating solution 11 then passes around the inlet 10 and under a fluid return gate 32. The opening formed by the fluid return gate 32 may be controlled by the control arm 34 to regulate the flow of electroplating solution 11 therethrough. After passing through the fluid return gate 32, the electroplating solution 11 passes through the outlet 36 and back to the pump filter mentioned above.

A complete cycle of the electroplating solution 11 through the substrate plating device 8 has been described. Those skilled in the art will appreciate that various adaptations and modifications of the just-described preferred embodiment can be configured without departing from the scope and spirit of the invention. Therefore, it is to be understood that, within the scope of the appended claims, the invention may be practiced other than as specifically described herein.

What is claimed is:

1. An apparatus for providing a uniform flow of an electroplating solution during electroplating of a substrate, comprising:

a container for holding a plating bath, the container having an inlet;

an inlet plate having an internal channel, the channel in fluid connection with the inlet for conducting the solution containing a desired plating material;

an insert plate having conical apertures for passing the electroplating solution from the insert plate into the plating bath and for providing an even distribution of the electroplating solution into the plating bath;

an anode;

a tunnel plate having a tunnel through which the electroplating solution passes, the solution having a laminar flow upon exiting the tunnel;

a cathode;

an outlet for expelling out of the plating bath the electroplating solution; and a pump system for circulating the solution between the inlet and the outlet.

2. The apparatus of claim 1, further including means for holding the substrate within the laminar flow of the electroplating solution and for facilitating a connection between the substrate and a cathode connected to a power supply.

3. The apparatus of claim 2, the holding means including a recess for receiving the substrate.

4. The apparatus of claim 3, the holding means including a apertures positioned around the recess, the apertures receiving the electroplating solution to allow passage of the electrolytic solution therethrough, while maintaining a laminar flow and even dispersal of the solution across the surface of the substrate.

5. The apparatus of claim 2, wherein the holding means is configured to hold a plurality of substrates.

6. The apparatus of claim 5, wherein the holding means is slidably removable.

7. The apparatus of claim 1, further including a fluid control plate to control solution flow, the fluid control plate being positioned downstream from the substrate holding plate and having apertures for passing the electroplating solution therethrough.

8. The apparatus of claim 7, wherein the fluid control plate is slidably removable.

9. The apparatus of claim 7, wherein the overflow plate is slidably removable.

10. The apparatus of claim 1, further including an overflow plate to maintain the liquid level in the tank and to insure effective solution movement to reduce contaminant particles descending to the bottom of the container.

11. The apparatus of claim 1, the tunnel having a cylindrical cross-section, the cross-sectional dimension of the tunnel being substantially similar to a cross-sectional dimension of the substrate to direct the solution flow onto the substrate uniformly and perpendicularly.

12. The apparatus of claim 11, wherein the tunnel plate is slidably removable.

13. The apparatus of claim 1, wherein the anode is comprised of a mesh to allow passage of the electroplating solution therethrough.

14. The apparatus of claim 1, further including a liquid level sensor, wherein sensors sounds an alarm to warn of a low level condition.

15. The apparatus of claim 1, wherein a plurality of the insert plate apertures has a cross-section decreasing in diameter in the direction of flow of the electroplating solution.

16. The apparatus of claim 1, further including a liquid level sensor, wherein the sensor automatically introduces additional solution to increase the solution volume to a desired the level in the container.

17. The apparatus of claim 1, further including a heater assembly to increase the temperature of the electroplating solution as it passes across the heater assembly.

18. A plating bath for electroplating a layer of metal onto a substrate, comprising:

a housing;

a source of electroplating solution recirculated through the housing;

an inlet plate having an internal channel for conducting the electroplating solution therethrough;

an insert plate having a plurality of conical apertures for conducting the electroplating solution therethrough;

a tunnel plate having a circumferential diameter for providing laminar flow to the solution exiting the tunnel;

a substrate support;

an anode and cathode; and a return.

19. An apparatus for electrodepositing a metal onto a substrate comprising:

a container for holding a plating bath, the container having an inlet;

an inlet plate having an internal channel, the channel in fluid connection with the inlet for conducting a solution containing a desired plating material;

an insert plate connected to the inlet plate, the insert plate having conical apertures for passing the electroplating solution from the insert plate into the plating bath and for providing an even distribution of the electroplating solution into the plating bath;

an anode;

a tunnel plate having a tunnel through which the electroplating solution passes, the solution having a laminar flow upon exiting the tunnel, the plate being slidably removable and the tunnel having a cylindrical cross-section, the cross-sectional dimension of the tunnel being substantantially similar to a cross-sectional dimension of the substrate to direct the solution flow onto the substrate uniformly and substantially perpendicularly;

a holding plate for retaining the substrate within the laminar flow of the electroplating solution and for facilitating a connection between the substrate and a cathode connected to a power supply, the holding means being slidably removable and including a recess for receiving the substrate and including a plurality of apertures positioned around the recess, the apertures receiving the electroplating solution to allow passage of the electrolytic solution therethrough, while maintaining a laminar flow and even dispersal of the solution across the surface of the substrate;

a cathode;

a fluid control plate to control solution flow, the fluid control plate being slidably removable and positioned downstream from the substrate holding plate and having apertures for passing the electroplating solution therethrough; and an overflow plate for maintaining the liquid level in the tank and to insure effective solution movement to reduce contaminant particles descending to the bottom of the container.

* * * * *